(12) United States Patent
Kato et al.

(10) Patent No.: US 9,826,661 B2
(45) Date of Patent: Nov. 21, 2017

(54) HEAT MODULE

(71) Applicant: NIDEC CORPORATION, Kyoto (JP)

(72) Inventors: Katsutoshi Kato, Kyoto (JP); Takehito Tamaoka, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 205 days.

(21) Appl. No.: 14/630,159

(22) Filed: Feb. 24, 2015

(65) Prior Publication Data

US 2015/0382507 A1 Dec. 31, 2015

(30) Foreign Application Priority Data

Jun. 28, 2014 (JP) ................................ 2014-133429

(51) Int. Cl.
*F28F 7/00* (2006.01)
*H05K 7/20* (2006.01)
*G06F 1/20* (2006.01)

(52) U.S. Cl.
CPC ......... *H05K 7/20272* (2013.01); *G06F 1/203* (2013.01); *H05K 7/20254* (2013.01); *H05K 7/20263* (2013.01); *G06F 2200/201* (2013.01)

(58) Field of Classification Search
CPC ........... H05K 7/20272; H05K 7/20254; H05K 7/20263; G06F 1/203; G06F 2200/201
USPC ........ 165/80.3, 80.4, 104.21, 104.31, 104.33
See application file for complete search history.

(56) References Cited

U.S. PATENT DOCUMENTS

| | | | |
|---|---|---|---|
| 2005/0217828 A1* | 10/2005 | Tomioka | F04D 29/582 165/104.31 |
| 2005/0243518 A1* | 11/2005 | Hata | G06F 1/203 361/699 |
| 2006/0162901 A1* | 7/2006 | Aizono | G06F 1/203 165/80.4 |
| 2006/0191667 A1* | 8/2006 | Chen | H05K 7/20272 165/80.4 |
| 2007/0070604 A1* | 3/2007 | Tomioka | F28D 1/05325 361/696 |
| 2007/0227709 A1* | 10/2007 | Upadhya | G06F 1/20 165/121 |
| 2008/0289802 A1 | 11/2008 | Nakajima et al. | |

(Continued)

FOREIGN PATENT DOCUMENTS

CN 101749968 A1 6/2010
CN 101752331 A 6/2010
(Continued)

*Primary Examiner* — Claire Rojohn, III
(74) *Attorney, Agent, or Firm* — Westerman, Hattori, Daniels & Adrian, LLP

(57) ABSTRACT

A heat module includes a heat receiving portion, a fluid channel, a fan, a radiator including heat dissipating fins and a radiator tube fluid channel, and a pump. The pump includes a stationary portion and a rotating portion. The rotating portion includes a rotor holder and a pump impeller. The pump further includes a casing, a pump fluid channel, a pump inlet, and a pump outlet. At least a portion of the rotor holder and at least a portion of the pump impeller are arranged to radially overlap with each other. The fluid channel includes a tube fluid channel. The tube fluid channel includes a pump inlet-side tube fluid channel, a pump outlet-side tube fluid channel, and a heat receiving portion tube fluid channel. No heat receiving portion tube fluid channel is arranged in the pump inlet-side tube fluid channel.

20 Claims, 8 Drawing Sheets

(56) References Cited

U.S. PATENT DOCUMENTS

| | | | | |
|---|---|---|---|---|
| 2009/0025416 A1* | 1/2009 | Murakami | F25B 41/04 | |
| | | | | 62/324.6 |
| 2009/0044928 A1* | 2/2009 | Upadhya | F28D 15/00 | |
| | | | | 165/81 |
| 2009/0218072 A1* | 9/2009 | Eriksen | H01L 23/473 | |
| | | | | 165/80.2 |
| 2009/0219693 A1* | 9/2009 | Dittmer | H05K 7/20272 | |
| | | | | 361/699 |
| 2010/0139891 A1 | 6/2010 | Suzuki et al. | | |
| 2010/0142145 A1 | 6/2010 | Suzuki et al. | | |
| 2011/0079376 A1* | 4/2011 | Loong | F28F 3/022 | |
| | | | | 165/185 |
| 2013/0028761 A1 | 1/2013 | Yokozawa et al. | | |
| 2015/0059360 A1* | 3/2015 | Lin | F25B 21/02 | |
| | | | | 62/3.2 |
| 2015/0237767 A1* | 8/2015 | Shedd | H05K 7/20254 | |
| | | | | 165/104.31 |
| 2016/0003261 A1* | 1/2016 | Tamaoka | F04D 25/0613 | |
| | | | | 415/177 |

FOREIGN PATENT DOCUMENTS

| | | |
|---|---|---|
| CN | 102900690 A | 1/2013 |
| EP | 0 563 993 A2 | 10/1993 |
| JP | 5-335454 A | 12/1993 |
| JP | 2004-251474 A | 9/2004 |
| JP | 2008-122058 A | 5/2008 |
| JP | 2009-75801 A | 4/2009 |
| JP | 2010-80564 A | 4/2010 |
| JP | 2010-133642 A | 6/2010 |
| JP | 2010-134693 A | 6/2010 |
| JP | 2010-156467 A | 7/2010 |
| JP | 2013-24217 A | 2/2013 |
| KR | 10-2010-0064326 A | 6/2010 |
| KR | 10-2010-0064340 A | 6/2010 |
| TW | 200822852 | 10/1996 |

* cited by examiner

HEAT MODULE

BACKGROUND OF THE INVENTION

Field of the Invention

The present invention relates to a heat module. In particular, the present invention relates to a heat module installed in an electronic device, such as, for example, a personal computer (PC).

Description of the Related Art

In the past, slim PCs, such as tablet PCs, were used mainly for Internet browsing, video viewing, and so on. In recent years, the slim PCs, such as the tablet PCs, have been used for playing of games which require a high processing speed, analysis simulation, and so on. For a high processing speed, a CPU which operates at a high clock frequency needs to be adopted, requiring measures against heat. A heat sink and a cooling fan are commonly used to cool the CPU, but because of a small thickness of the tablet PC, a cooling fan of the tablet PC generally has air-blowing performance lower than that of a cooling fan of a common notebook PC or of a common desktop PC. Thus, there is a demand for a heat module which has a small thickness and improved cooling performance. Heat modules generally use air for forced cooling. In other words, air-cooled heat modules are generally used. In a typical air-cooled heat module, a heat sink made of copper or aluminum, which has a high thermal conductivity, is provided to receive heat from a heat source, and a fan is used to blow air to the heat sink to dissipate the heat. Meanwhile, a heat sink is sometimes arranged away from a heat source. In such a case, a heat pipe is sometimes used to thermally connect the heat sink with the heat source. This method is often adopted in PCs and the like. However, in the air-cooled heat module, the heat sink is often arranged away from the heat source, and the heat sink is cooled. Thus, the air volume of the cooling fan needs to be increased to improve cooling performance of the air-cooled heat module. Meanwhile, as mentioned above, a cooling fan installed in a slim PC, such as a tablet PC, has a small thickness, and has a smaller air volume than that of a cooling fan of a PC having a larger thickness. That is, it is difficult to improve the cooling performance with the air-cooled heat module.

Accordingly, in particular, in the case where heat generated by a heat source has a high temperature, a water-cooled heat module is often used. For example, JP-A 2010-134693 discloses a cooling jacket with which an electronic component is in contact and which cools the electronic component by circulating a coolant within a channel, a cooling unit including the cooling jacket, a cooling system including the cooling unit, and an electronic device including the cooling system.

However, in the cooling jacket, the cooling unit, the cooling system, and the electronic device as disclosed in JP-A 2010-134693, a channel through with a coolant circulates is defined by a jacket 10, a case 11a, and a cover 11b. The case 11a and the cover 11b are fitted to each other to define the channel therebetween. A heat module in this case has a large thickness, and it is difficult to install such a heat module in an air-cooled notebook PC or an air-cooled tablet PC. There is a demand for a heat module having a simpler structure and a reduced thickness. The present invention has been conceived mainly to reduce the thickness of the heat module and improve the cooling performance of the heat module.

SUMMARY OF THE INVENTION

A heat module according to a first preferred embodiment of the present invention includes a heat receiving portion, a fluid channel, a fan, a radiator, and a pump. The heat receiving portion is arranged to be in thermal contact with a heat source. A coolant to transfer heat of the heat receiving portion is sealed in the fluid channel. The radiator is arranged at an air outlet of the fan, and includes a plurality of heat dissipating fins and a radiator tube fluid channel. The pump includes a stationary portion including a stator, and a rotating portion including a magnet arranged radially outside of the stator. The rotating portion further includes a rotor holder arranged to hold the magnet with an inner circumferential surface thereof, and a pump impeller arranged to surround the stator radially outside of the stator, and supported to be rotatable with respect to the stator. The pump further includes a casing made of a resin and arranged to surround the pump impeller radially outside of the stator, a pump fluid channel defined between the pump impeller and the casing, and a pump inlet and a pump outlet each of which is connected with the pump fluid channel and extends outwardly of the casing. At least a portion of the rotor holder and at least a portion of the pump impeller are arranged to radially overlap with each other. The fluid channel includes a tube fluid channel arranged to join the radiator tube fluid channel and the pump fluid channel to each other. The tube fluid channel includes a pump inlet-side tube fluid channel arranged to join the radiator tube fluid channel and the pump inlet to each other, a pump outlet-side tube fluid channel arranged to join the pump outlet and the radiator tube fluid channel to each other, and a heat receiving portion tube fluid channel arranged to transfer heat of the heat source to the coolant at the heat receiving portion.

No heat receiving portion tube fluid channel is arranged in the pump inlet-side tube fluid channel.

A heat module according to a second preferred embodiment of the present invention includes a plurality of heat receiving portions, a fluid channel, a fan, a radiator, and a pump. The plurality of heat receiving portions are arranged to be in thermal contact with a plurality of heat sources which generate different amounts of heat. A coolant to transfer heat of each heat receiving portion is sealed in the fluid channel. The radiator is arranged at an air outlet of the fan, and includes a plurality of heat dissipating fins and a radiator tube fluid channel. The pump includes a stationary portion including a stator, and a rotating portion including a magnet arranged radially outside of the stator. The rotating portion further includes a rotor holder arranged to hold the magnet with an inner circumferential surface thereof, and a pump impeller arranged to surround the stator radially outside of the stator, and supported to be rotatable with respect to the stator. The pump further includes a casing made of a resin and arranged to surround the pump impeller radially outside of the stator, a pump fluid channel defined between the pump impeller and the casing, and a pump inlet and a pump outlet each of which is connected with the pump fluid channel and extends outwardly of the casing. At least a portion of the rotor holder and at least a portion of the pump impeller are arranged to radially overlap with each other. The fluid channel includes a tube fluid channel arranged to join the radiator tube fluid channel and the pump fluid channel to each other. The tube fluid channel includes a pump inlet-side tube fluid channel arranged to join the radiator tube fluid channel and the pump inlet to each other, a pump outlet-side tube fluid channel arranged to join the pump outlet and the radiator tube fluid channel to each other, and a plurality of heat receiving portion tube fluid channels each of which is arranged to transfer heat of a separate one of the plurality of heat sources to the coolant at a corresponding one of the plurality of heat receiving portions. The heat receiving portion tube fluid channel at which the heat source which generates a largest amount of heat of all the plurality of heat sources is arranged is arranged in the pump outlet-side tube fluid channel.

The heat module according to the above first preferred embodiment of the present invention is able to achieve reduced thickness and improved cooling performance.

The heat module according to the above second preferred embodiment of the present invention is able to achieve reduced thickness and improved cooling performance.

The above and other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
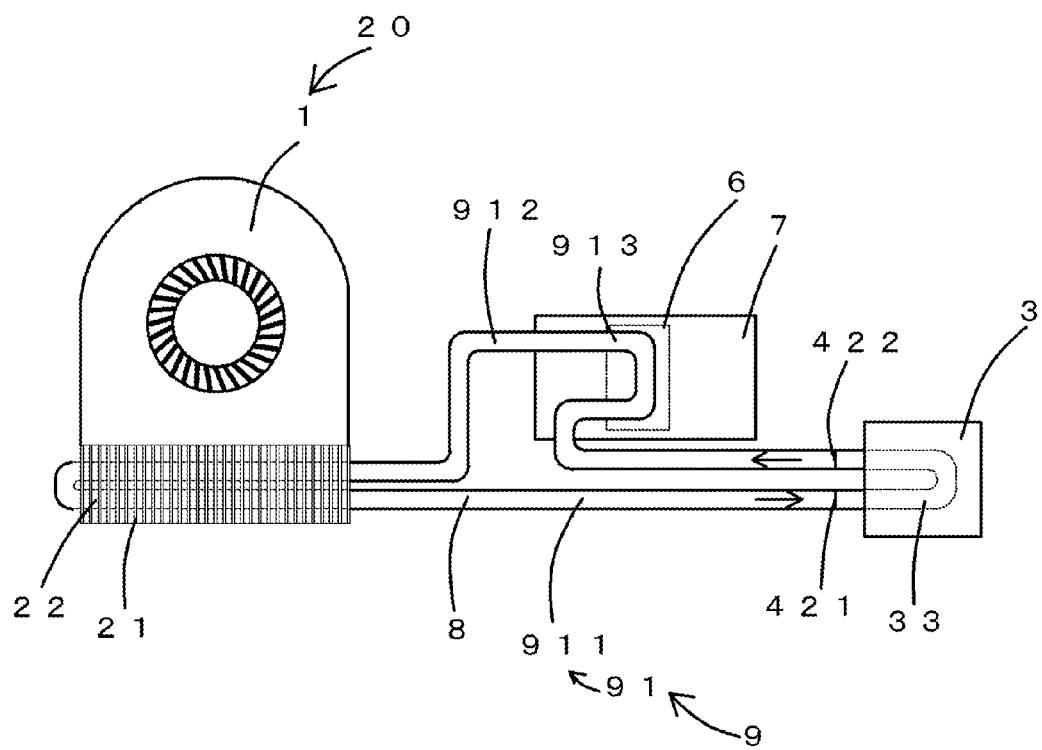
FIG. 1 is a schematic diagram of a heat module according to a first preferred embodiment of the present invention.

It is assumed herein that an upper side and a lower side in an axial direction parallel to a central axis of a pump 3 of a heat module 100 in FIG. 1 are referred to simply as an upper side and a lower side, respectively. Note that a vertical direction assumed herein may not necessarily correspond with a vertical direction of the heat module 100 when the heat module 100 is actually installed in a device. It is also assumed herein that a circumferential direction about the central axis is referred to simply by the term "circumferential direction", "circumferential", or "circumferentially", and that radial directions centered on the central axis are referred to simply by the term "radial direction", "radial", or "radially".

FIG. 1 is a schematic diagram of a heat module 100 according to a first preferred embodiment of the present invention. The heat module 100 is of a water-cooled type. The heat module 100 includes a fan 1, a pump 3, a heat receiving portion 7, a fluid channel 9, and a radiator 20. The fan 1 according to the present preferred embodiment is a centrifugal fan. The radiator 20 is arranged to be in thermal connection with the fan 1, and is arranged at an air outlet (not shown) of the fan 1. The pump 3 is connected with both the heat receiving portion 7 and the radiator 20 through the fluid channel 9. A coolant 8 is arranged in the fluid channel 9. More specifically, within the fluid channel 9, the coolant 8 is discharged from the pump 3, passes through the heat receiving portion 7, flows into a radiator tube fluid channel 22 described below, and flows from the radiator tube fluid channel 22 to the pump 3 through the fluid channel 9. Here, water, an antifreeze, or the like, for example, is used as the coolant 8.

Figure 2:
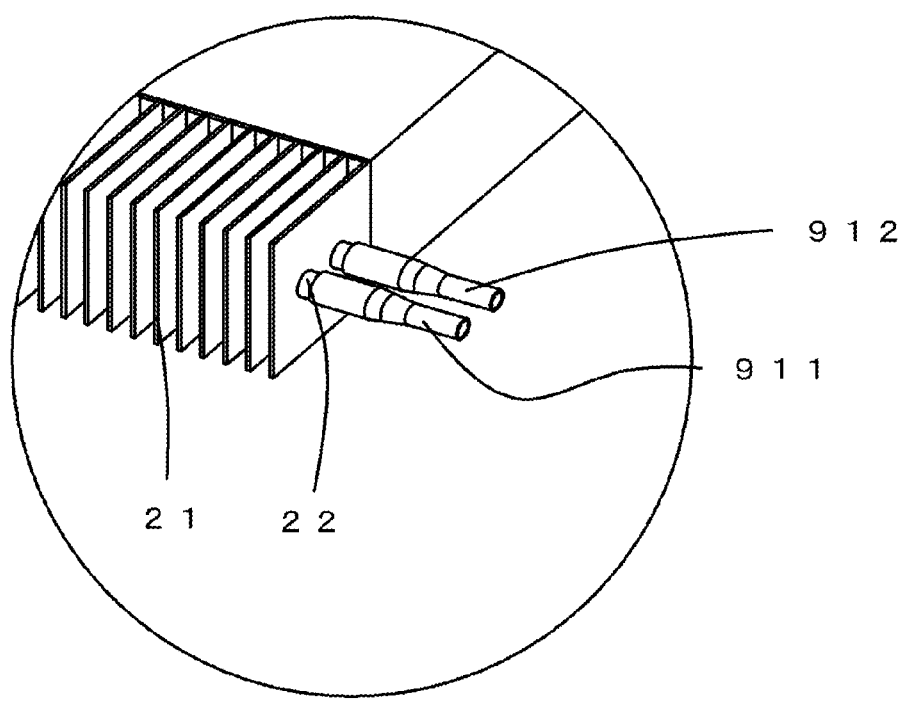
FIG. 2 is a perspective view of a radiator according to the first preferred embodiment of the present invention.

The radiator 20 includes a plurality of heat dissipating fins 21 and the radiator tube fluid channel 22. Each of the heat dissipating fins 21 is, for example, in the shape of the letter "U", and the heat dissipating fins 21 are, for example, arranged in parallel with one another. A wind caused by the fan 1 passes through a passage defined between adjacent ones of the heat dissipating fins 21 arranged in parallel with one another. The radiator tube fluid channel 22 is arranged to be in thermal contact with the plurality of fins 21. In other words, the radiator tube fluid channel 22 is arranged to overlap with the plurality of fins 21 in a plan view. Referring to FIG. 2, the radiator tube fluid channel 22 is arranged to pass through the plurality of fins 21. A water-cooled heat module often uses a radiator made of a metal, taking account of a heat dissipation characteristic. Thus, the radiator 20 is made of a metal. Note, however, that the radiator 20 may not necessarily be made of the metal, but may be made of a resin material having an excellent heat dissipation characteristic or a high thermal conductivity. The radiator tube fluid channel 22 is preferably arranged to pass from one end to an opposite end of the plurality of fins 21 and back at least once. By arranging the radiator tube fluid channel 22 to pass from one end to the opposite end of the plurality of fins 21 and back at least once, a total area over which the plurality of fins 21 and the radiator tube fluid channel 22 are in contact with each other is increased, and cooling performance of the radiator 20 is improved. The radiator tube fluid channel 22 is defined by a tube made of copper or aluminum. Note that the tube may be made of any material having an excellent thermal conductivity.

The fluid channel 9 includes a tube fluid channel 91, the radiator tube fluid channel 22, and a pump fluid channel 33. The tube fluid channel 91 is arranged to join the radiator tube fluid channel 22 and the pump fluid channel 33 to each other. The tube fluid channel 91 includes a pump inlet-side tube fluid channel 911 and a pump outlet-side tube fluid channel 912. The pump inlet-side tube fluid channel 911 is arranged to join the radiator tube fluid channel 22 and a pump inlet 421 to each other. The pump outlet-side tube fluid channel 912 is arranged to join a pump outlet 422 and the radiator tube fluid channel 22 to each other. The pump outlet-side tube fluid channel 912 includes a heat receiving portion tube fluid channel 913. The heat receiving portion tube fluid channel 913 is arranged to transfer heat of a heat source 6 to the coolant 8 at the heat receiving portion 7.

Figure 3:
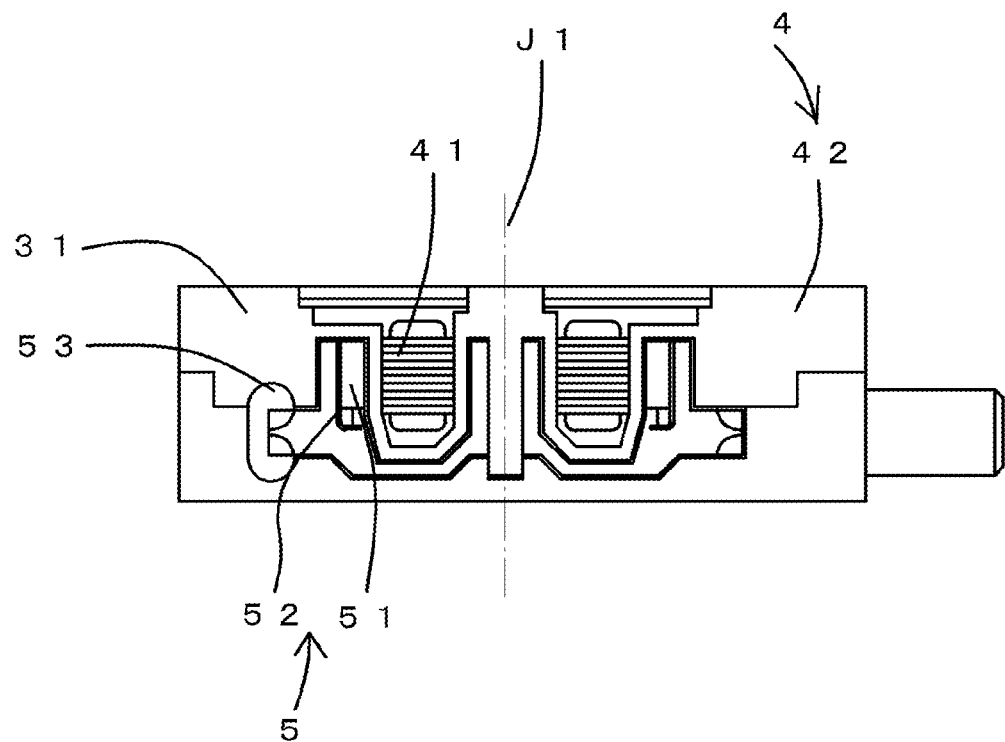
FIG. 3 is a cross-sectional view of a pump according to the first preferred embodiment of the present invention.

FIG. 3 is a cross-sectional view of the pump 3 according to the first preferred embodiment. The pump 3 is of an outer-rotor type. The pump 3 includes a motor portion 30, a pump impeller 53, a casing 42, and the pump fluid channel 33. The pump impeller 53 is arranged to extend radially outward from a rotating portion 5 of the motor portion 30. The pump impeller 53 is caused by the motor portion 30 to rotate about a central axis J1.

In the pump 3, the pump impeller 53 is caused by the motor portion 30 to rotate about the central axis J1 to move the coolant 8 in the pump fluid channel 33. The pump 3 is a regenerative pump. That is, the pump 3 is arranged to generate vortices between the casing 42 and the pump impeller 53 to discharge the coolant 8 with high pressure.

The motor portion 30 includes a stationary portion 4 and the rotating portion 5. The pump impeller 53 is a portion of the rotating portion 5. The casing 42 is arranged to accommodate the motor portion 30 and the pump impeller 53. The casing 42 is a portion of the stationary portion 4.

The stationary portion 4 includes a stator 41 and the casing 42. The casing 42 is arranged to surround the pump impeller 53 radially outside of the stator 41, and is made of a resin. The casing 42 includes the pump inlet 421 through which the coolant 8 is sucked into the pump 3, and the pump outlet 422 through which the coolant 8 is discharged out of the pump 3.

The rotating portion 5 includes a magnet 51, a rotor holder 52, and the pump impeller 53. The magnet 51 is arranged radially outside of the stator 41. The rotor holder 52 holds the magnet 51 with an inner circumferential surface thereof. The pump impeller 53 is arranged to surround the stator 41 radially outside of the stator 41, and is supported to be rotatable with respect to the stator 41. At least a portion of the rotor holder 52 and at least a portion of the pump impeller 53 are arranged to radially overlap with each other.

Cases of most tablet PCs have a thickness of 10 mm or less. Cases of most notebook PCs have a thickness of 30 mm or less. For example, a case of a typical notebook PC in which a water-cooled heat module is installed has a thickness of about 50 mm, which is greater than the thickness of a case of a common notebook PC in which an air-cooled heat module is installed. Tablet PCs and notebook PCs are designed with portability in mind, and users expect that cases of the tablet PCs and the notebook PCs, even if they have a water-cooled heat module installed therein, will have a thickness comparable to or smaller than the thickness of a case of a model in which a common air-cooled heat module is installed or of a model in which no heat module is installed. Thus, as mentioned above, a case of a notebook PC in which a water-cooled heat module is installed is expected to have a thickness of 30 mm or less, whereas a case of a tablet PC in which a water-cooled heat module is installed is expected to have a thickness of 10 mm or less. Thus, the water-cooled heat module needs to be installed in a notebook PC whose case has a thickness of 30 mm or less, and also, the water-cooled heat module needs to be installed in a tablet PC whose case has a thickness of 10 mm or less. Therefore, there is a demand for a reduction in the thickness of the water-cooled heat module. In addition, since the notebook PCs and the tablet PCs are designed with portability in mind as mentioned above, there is also a demand for a reduction in the weight of the notebook PCs and the tablet PCs, and there is also a demand for a reduction in the weight of heat modules installed in the notebook PCs and the tablet PCs. Many water-cooled heat modules use a radiator made of a metal, taking account of the heat dissipation characteristic. Note that the radiator may not necessarily be made of the metal, but may be made of a resin material having an excellent heat dissipation characteristic or a high thermal conductivity. In the case where the radiator is made of a metal, the weight of the heat module is increased. A fluid channel in which a coolant flows in the heat module has a high channel resistance. Thus, a need to circulate the coolant through the fluid channel having a high channel resistance requires a high-head pump. Accordingly, in a water-cooled heat module, a pump having a large thickness is often adopted. However, a small thickness of the pump is essential to limiting the thickness of the heat module.

Referring to FIG. 1, no heat receiving portion tube fluid channel 913 is arranged in the pump inlet-side tube fluid channel 911. According to the present preferred embodiment, the heat receiving portion tube fluid channel 913 is arranged only in the pump outlet-side tube fluid channel 912. A flow to cool the heat source 6 arranged at the heat receiving portion 7 according to the present preferred embodiment will now be described below. Heat generated at the heat source 6 is transferred to the coolant 8 within the heat receiving portion tube fluid channel 913 through the heat receiving portion 7. That is, the coolant 8 absorbs the heat generated at the heat source 6. Further, the coolant 8 flows into the radiator tube fluid channel 22 through the pump outlet-side tube fluid channel 912. Within the radiator 20, the heat is transferred from the coolant 8 flowing in the radiator tube fluid channel 22 to the radiator 20. The radiator 20 includes the plurality of heat dissipating fins 21, and the heat is also transferred from the coolant 8 to the heat dissipating fins 21. An air flow traveling toward the radiator 20 is generated by the fan 1. Air staying near a surface of the radiator 20 including the heat dissipating fins 21 is caused by the air flow to travel away from the surface of the radiator 20. The radiator 20 is thus air-cooled, efficiently dissipating the heat received from the coolant 8 to accomplish heat exchange. Thus, the temperature of a portion of the coolant 8 on an outlet side of the radiator tube fluid channel 22 is lower than the temperature of a portion of the coolant 8 on an inlet side of the radiator tube fluid channel 22. Once the coolant 8 is discharged out of the radiator tube fluid channel 22, the coolant 8 passes through the pump inlet-side tube fluid channel 911 to be sucked into the pump fluid channel 33 through the pump inlet 421. Within the pump 3, rotation of the pump impeller 53 imparts kinetic energy to the coolant 8 to cause the coolant 8 to circulate in the pump fluid channel 33. Thereafter, the coolant 8 returns to the heat receiving portion tube fluid channel 913 through the pump outlet-side tube fluid channel 912. The coolant 8 has been reduced in temperature by the heat exchange by the radiator 20, and is therefore able to absorb a large amount of heat from the heat receiving portion 7.

As is apparent from the above description, the temperature of the coolant 8 becomes lowest when the coolant 8 is passing through the pump inlet-side tube fluid channel 911. That is, according to the present preferred embodiment, the coolant 8 flowing in the fluid channel 9 has a relatively low temperature when passing through the pump fluid channel 33, and this contributes to preventing demagnetization of the magnet 51 of the pump 3, a damage to coils of the stator 41, and other problems. Thus, according to the present preferred embodiment, the pump 3 having a small thickness can be adopted, and the thickness of the heat module 100 as a whole can be reduced.

According to the present preferred embodiment, the heat receiving portion tube fluid channel 913 is arranged only in the pump outlet-side tube fluid channel 912. Note, however, that the number of heat sources 6 and the arrangement of the heat source(s) 6 may be modified appropriately as long as no heat receiving portion tube fluid channel 913 is arranged in the pump inlet-side tube fluid channel 911. Modifications of the first preferred embodiment, in which the number of heat sources 6 and the arrangement of the heat source(s) 6 are modified, will now be described in detail below.

Figure 4:
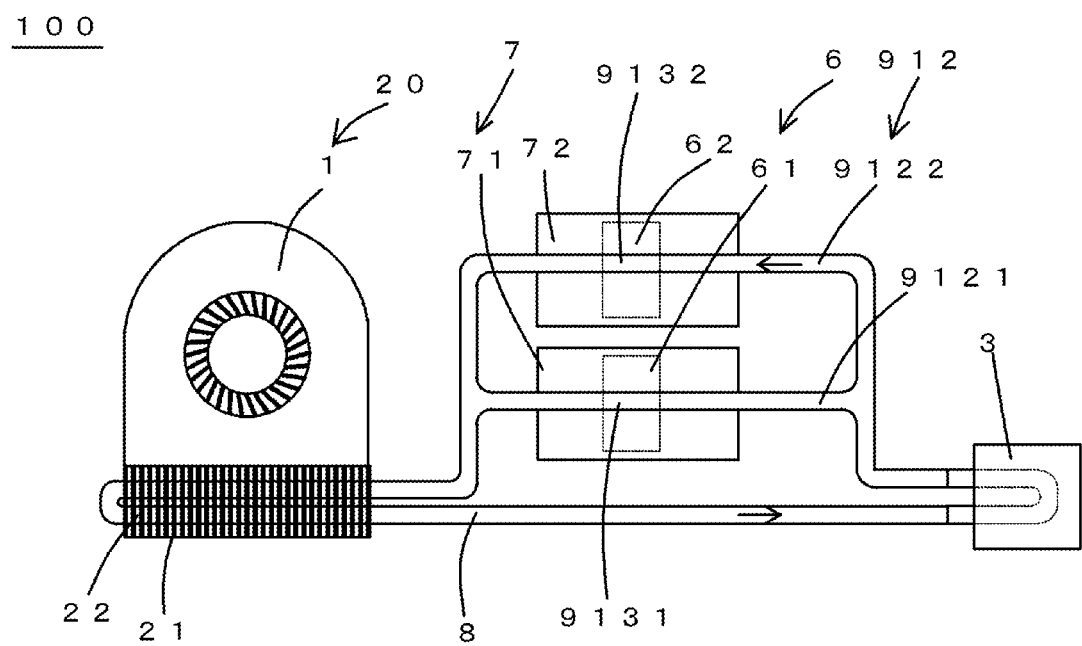
FIG. 4 is a schematic diagram of a heat module according to a modification of the first preferred embodiment of the present invention.

FIG. 4 is a schematic diagram of a heat module 100 according to a modification of the first preferred embodiment of the present invention. In this modification, a plurality of heat sources 6 are provided. A heat receiving portion 7 is arranged to be in thermal contact with each of the plurality of heat sources 6. The plurality of heat sources 6 include a heat source 61 which generates a large amount of heat, and a heat source 62 which generates a small amount of heat.

When the plurality of heat sources 6 are provided, a total amount of heat generated from objects to be cooled by the heat module 100 is increased. In this case, the amount of heat which a coolant 8 absorbs from the heat sources 6 is increased. That is, the temperature of the coolant 8 is increased. To achieve a reduction in the thickness of the heat module 100, the thickness of each of the heat receiving portion 7, a radiator 20, a fan 1, and a pump 3 needs to be reduced. A reduction in the thickness of the radiator 20 and of the fan 1 leads to a reduction in heat exchange efficiency, and to a reduction in heat dissipation by the coolant 8. That is, the temperature of the coolant 8 being sucked into the pump 3 through a pump inlet 421 is increased. However, since the plurality of heat sources 6 are arranged between a pump outlet 422 and the radiator 20, the temperature of the coolant 8 becomes highest at a portion of a pump outlet-side tube fluid channel 912 between the heat sources 6 and a radiator tube fluid channel 22. That is, since the coolant 8 is cooled by the radiator 20, the temperature of the coolant 8 is low when the coolant 8 is sucked into the pump 3 through the pump inlet 421, and this contributes to preventing a damage to the pump 3 and to allowing the heat module 100 to maintain its function.

After the coolant 8 is discharged out of the pump 3 into the pump outlet-side tube fluid channel 912 through the pump outlet 422, the coolant 8 flows into a first fluid channel 9121 and a second fluid channel 9122 to reach a high-temperature heat receiving portion 71 and a low-temperature heat receiving portion 72, respectively. After the coolant 8 is discharged out of the pump 3 through the pump outlet 422, the coolant 8 flows into a low-temperature heat receiving portion tube fluid channel 9132 and a high-temperature heat receiving portion tube fluid channel 9131 without being exposed to heat generated from the heat source 61 which generates a large amount of heat, or to heat generated from the heat source 62 which generates a small amount of heat. Thus, efficiency with which the coolant 8 absorbs heat at the low-temperature heat receiving portion tube fluid channel 9132 and at the high-temperature heat receiving portion tube fluid channel 9131 is improved.

Figure 5:
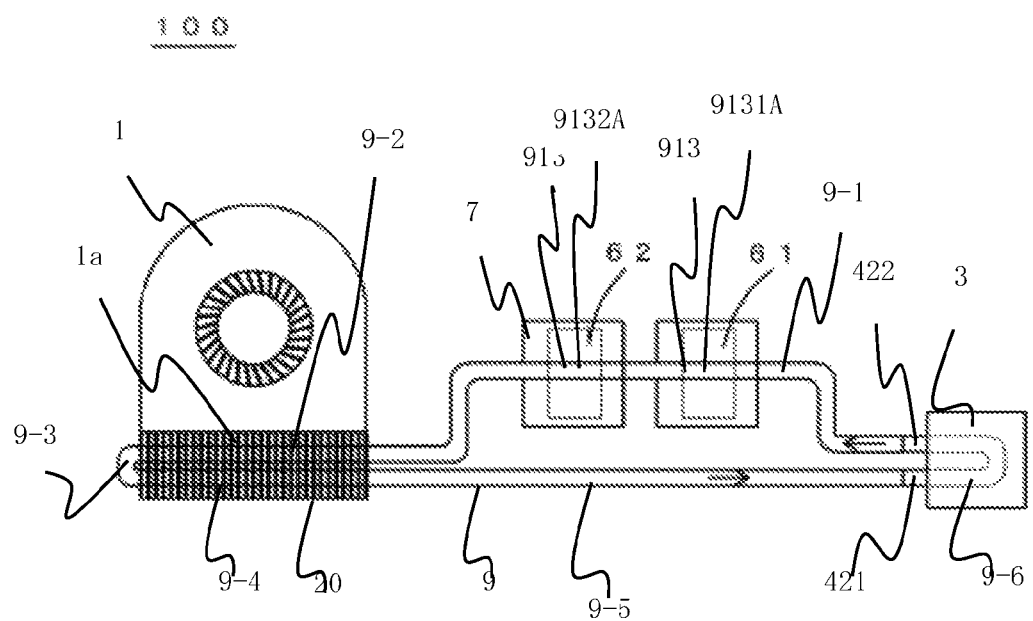
FIG. 5 is a schematic diagram of a heat module according to another modification of the first preferred embodiment of the present invention.

In addition, of all the plurality of heat sources 6, the heat source 6 which generates the largest amount of heat is arranged closest to the pump outlet 422 along the pump outlet-side tube fluid channel 912. Thus, the distance between the pump outlet 422 and the heat source 6 which generates the largest amount of heat is the shortest of all the distances between the pump outlet 422 and the plurality of heat sources 6. FIG. 5 is a schematic diagram of a heat module 100 according to another modification of the first preferred embodiment of the present invention. In this modification, two heat sources 61 and 62 are arranged in series between a pump outlet 422 and a radiator 20. Of the two heat sources 61 and 62, the heat source 61 generates the larger amount of heat, and is arranged the closer to the pump outlet 422. The centrifugal fan 1 has a single air outlet 1a. The fluid channel 9 includes a first fluid channel part 9-1, a second fluid channel part 9-2, a third fluid channel part 9-3, a fourth fluid channel part 9-4, a fifth fluid channel part 9-5 and a sixth fluid channel part 9-6.

Notebook PCs and tablet PCs generally include a plurality of heat sources 6, such as a CPU and a GPU. The CPU and the GPU generally generate different amounts of heat depending on the application of the PC. For example, a GPU which operates at a high clock frequency is installed in a PC which is designed for playing a game which uses high definition images. In such a PC, the GPU generates a greater amount of heat than the CPU. Meanwhile, in a PC which is mainly designed for arithmetic processing, such as running analysis software, rather than for displaying high definition images, the CPU generates a greater amount of heat than the GPU. In the case where the heat source 61 which generates a large amount of heat is arranged upstream of the heat source 62 which generates a small amount of heat along a pump outlet-side tube fluid channel 912, for example, a coolant 8 absorbs heat from the heat source 61 which generates a large amount of heat, and the temperature of the coolant 8 is increased. Then, the coolant 8 having a high temperature passes through a heat receiving portion tube fluid channel 913 for the heat source 62 which generates a small amount of heat. If there is a great difference between the amount of heat generated by the heat source 61 which generates a large amount of heat and the amount of heat generated by the heat source 62 which generates a small amount of heat, the temperature of the coolant 8 may be higher than the temperature of the heat source 62 when the coolant 8 passes through the heat receiving portion tube fluid channel 913 for the heat source 62. Thus, an effect of cooling the heat source 62 which generates a small amount of heat can be improved when the modification of the first preferred embodiment illustrated in FIG. 4 is adopted.

Figure 6:
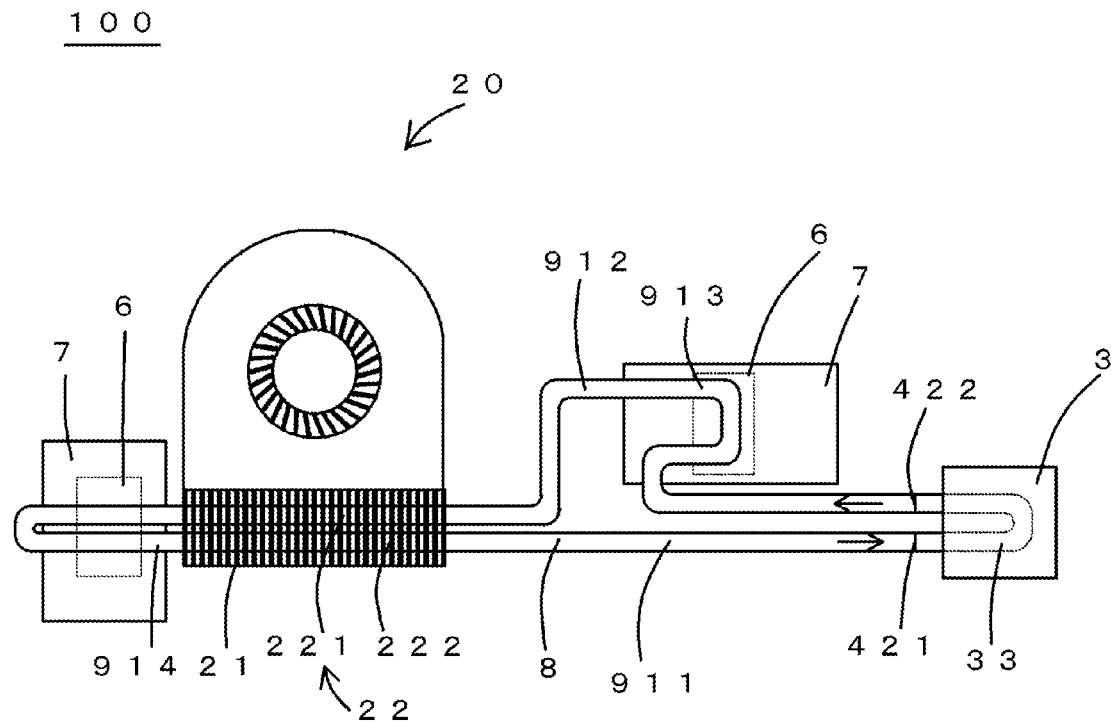
FIG. 6 is a schematic diagram of a heat module according to yet another modification of the first preferred embodiment of the present invention.

FIG. 6 is a schematic diagram of a heat module 100 according to another modification of the first preferred embodiment of the present invention. In this modification, a radiator tube fluid channel 22 includes a first radiator tube fluid channel 221 connected with a pump outlet-side tube fluid channel 912, and a second radiator tube fluid channel 222 connected with a pump inlet-side tube fluid channel 911. A tube fluid channel 91 further includes a radiator connection tube fluid channel 914 arranged to join the first radiator tube fluid channel 221 and the second radiator tube fluid channel 222 to each other. A heat receiving portion tube fluid channel 913 is arranged in the radiator connection tube fluid channel 914. In the case where only one heat source 6 is provided, the heat receiving portion tube fluid channel 913 is arranged only in the radiator connection tube fluid channel 914.

A heat receiving portion 7 which receives heat from a heat source 6 is arranged in the radiator connection tube fluid channel 914. Thus, a coolant 8 flows into the radiator connection tube fluid channel 914 after dissipating heat at a radiator 20, and the coolant 8 is able to effectively absorb heat from the heat source 6. Further, after absorbing the heat, the coolant 8 flows out of the radiator connection tube fluid channel 914 and thereafter flows into the second radiator tube fluid channel 222 to dissipate the heat at the radiator 20. In the case where two heat sources 6 are provided, for example, it is preferable that one of the heat sources 6 be arranged in the radiator connection tube fluid channel 914, and the other heat source 6 be arranged in the pump outlet-side tube fluid channel 912. In this case, the coolant 8 passing through the heat receiving portion tube fluid channel 913 at each of the heat sources 6 has dissipated heat at the radiator 20, and thus, heat of each of the heat sources 6 can be effectively dissipated. Thus, an improvement in cooling performance of the heat module 100 is achieved.

Note that two or more heat sources 6 may be arranged at the radiator connection tube fluid channel 914.

The area of a cross section of the radiator tube fluid channel 22 perpendicular to the length of the radiator tube fluid channel 22 is greater than the area of a cross section of the tube fluid channel 91 perpendicular to the length of the tube fluid channel 91.

To reduce the thickness of the heat module 100, the thickness of each of the radiator 20, a fan 1, and a pump 3 needs to be reduced. For example, in the case of a heat module having a large thickness, a radiator has a large area through which heat is dissipated, and is therefore able to perform heat exchange with high efficiency; a fan blows a large amount of air, leading to an increase in efficiency of air cooling of the radiator; and a pump has a high flow rate and a high head, and is able to circulate a large amount of fluid in a fluid channel at a high speed. On the other hand, in the case of a heat module having a small thickness, the radiator 20 has a small area through which heat is dissipated, and heat exchange efficiency is lower than in the case of the heat module having a large thickness; the fan 1 blows a small amount of air, and efficiency of air cooling of the radiator 20 is lower than in the case of the heat module having a large thickness; and the pump 3 has a low flow rate and a low head, and the amount of the fluid in the fluid channel is necessarily smaller than in the case of the heat module having a large thickness.

Optimum cooling performance of the heat module 100 having a small thickness can be accomplished by maximizing the flow rate of the pump 3. The flow rate decreases as channel resistance in the fluid channel increases. Therefore, it is important to reduce the channel resistance in the fluid channel. It is desirable that the length of the radiator tube fluid channel 22 be greater for heat exchange. Meanwhile, the width, depth, and height of the radiator 20 are predetermined, and it is therefore necessary to make the radiator tube fluid channel 22 meander to increase the length of the radiator tube fluid channel 22. Meandering of the radiator tube fluid channel 22 allows an inertial force of the circulating coolant to be exerted on a bend portion of the radiator tube fluid channel 22 to increase the channel resistance. Thus, it is preferable to arrange the cross-sectional area of the radiator tube fluid channel 22 to be greater than the cross-sectional area of the pump outlet-side tube fluid channel 912. This will minimize an increase in the channel resistance, reducing a reduction in the flow rate of the pump 3.

In the heat module 100 having a small thickness, the inside diameter of the tube fluid channel 91 is small, and the total amount of the coolant 8 in the fluid channel 9 is small. Therefore, a low head of the pump 3 to circulate the coolant 8 is permissible. That is, a pump having a very small size could fulfill required cooling performance. The heat module 100 can be optimum with a reduced thickness when the small amount of coolant 8 is efficiently circulated to promote heat absorption and heat exchange.

In the pump outlet-side tube fluid channel 912, a portion of the tube fluid channel 91 between the pump outlet 422 and the heat receiving portion 7 is shorter than a portion of the tube fluid channel 91 between the heat receiving portion 7 and the radiator tube fluid channel 22.

When the portion of the tube fluid channel 91 between the heat receiving portion 7 and the radiator tube fluid channel 22 is arranged to be longer than the portion of the tube fluid channel 91 between the pump outlet 422 and the heat receiving portion 7, the amount of heat which is dissipated at the portion of the tube fluid channel 91 between the heat receiving portion 7 and the radiator tube fluid channel 22 is increased to decrease the temperature of the coolant 8 before the coolant 8 flows into the radiator tube fluid channel 22. Thus, the cooling performance of the heat module 100 is improved.

The tube fluid channel 91 is defined by a flexible tube made of a thermally conductive material. Further, the heat module 100 is installed on a base made of a metal or on a case made of a metal, and the flexible tube is arranged to be in thermal contact with the base or the case.

When the tube fluid channel 91 is defined by the flexible tube made of the thermally conductive material, heat of the coolant 8 can be dissipated outwardly through the tube. Thus, the cooling performance of the heat module 100 is improved. Further, when the flexible tube made of the thermally conductive material is arranged to be in thermal contact with the base made of the metal or the case made of the metal, the heat of the coolant 8 inside the flexible tube is transferred to the flexible tube and then to the base made of the metal or the case made of the metal. That is, the heat of the coolant 8 can be effectively dissipated. Thus, the cooling performance of the heat module 100 is improved.

Figure 7:
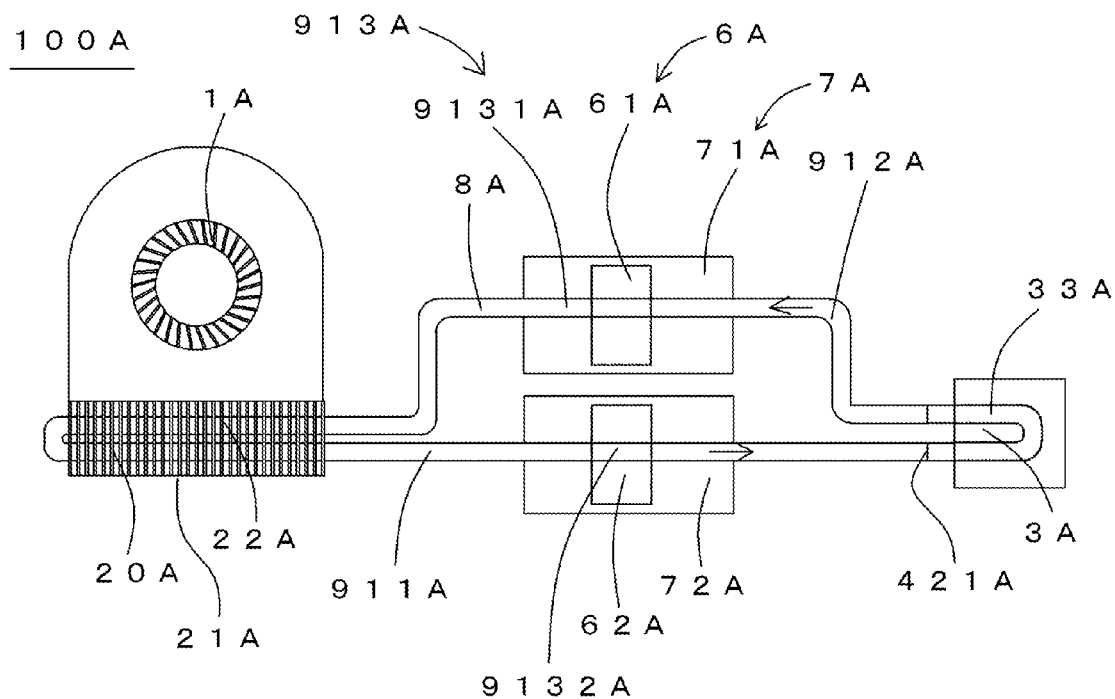
FIG. 7 is a schematic diagram of a heat module according to a second preferred embodiment of the present invention.

FIG. 7 is a bottom view of a heat module 100A according to a second preferred embodiment of the present invention. The basic structure of the heat module 100A according to the second preferred embodiment is identical to the basic structure of the heat module 100 according to the first preferred embodiment. Accordingly, a description of the second preferred embodiment will be limited to differences from the first preferred embodiment.

In the second preferred embodiment, a plurality of heat receiving portions 7A and a plurality of heat sources 6A which generate different amounts of heat are provided. Each heat receiving portion 7A is arranged to be in thermal contact with a separate one of the heat sources 6A. The heat sources 6A include a heat source 61A which generates a large amount of heat, and a heat source 62A which generates a small amount of heat. The heat source 61A, which generates the largest amount of heat of all the heat sources 6A, is arranged at a heat receiving portion tube fluid channel 9131A. Further, the heat receiving portion tube fluid channel 9131A is arranged in a pump outlet-side tube fluid channel 912A. The heat receiving portions 7A include a high-temperature heat receiving portion 71A and a low-temperature heat receiving portion 72A.

Since the heat receiving portion tube fluid channel 9131A at which the heat source 61A which generates the largest amount of heat is arranged is arranged in the pump outlet-side tube fluid channel 912A, a coolant 8A, after absorbing heat from the heat source 61A which generates the largest amount of heat, necessarily passes through a radiator 20A before flowing into a pump 3A. The coolant 8A has the highest temperature within a fluid channel 9A immediately after absorbing heat from the heat source 61A which generates the large amount of heat. Thus, the coolant 8A is prevented from flowing into the pump 3A while having the highest temperature.

The low-temperature heat receiving portion 72A for the heat source 62A which generates a small amount of heat is arranged at a pump inlet-side tube fluid channel 911A. More specifically, the heat source 61A which generates a large amount of heat is arranged at the pump outlet-side tube fluid channel 912A, while the low-temperature heat receiving portion 72A for the heat source 62A which generates a small amount of heat is arranged at the pump inlet-side tube fluid channel 911A.

A flow to cool the heat source 61A arranged at the high-temperature heat receiving portion 71A and the heat source 62A arranged at the low-temperature heat receiving portion 72A according to the second preferred embodiment will now be described below. Heat generated at the heat source 61A is transferred to the coolant 8A within a heat receiving portion tube fluid channel 9131A through the high-temperature heat receiving portion 71A. That is, the coolant 8A absorbs the heat generated at the heat source 61A. Further, the coolant 8A flows into a radiator tube fluid channel 22A through the pump outlet-side tube fluid channel 912A. Within the radiator 20A, the heat is transferred from the coolant 8A flowing in the radiator tube fluid channel 22A to the radiator 20A. The radiator 20A includes a plurality of heat dissipating fins 21A, and the heat is also transferred from the coolant 8A to the heat dissipating fins 21A. An air flow traveling toward the radiator 20A is generated by a fan 1A. Air staying near a surface of the radiator 20A including the heat dissipating fins 21A is caused by the air flow to travel away from the surface of the radiator 20A. The radiator 20A is thus air-cooled, efficiently dissipating the heat received from the coolant 8A to accomplish heat exchange. Thus, the temperature of a portion of the coolant 8A on an outlet side of the radiator tube fluid channel 22A is lower than the temperature of a portion of the coolant 8A on an inlet side of the radiator tube fluid channel 22A. Once the coolant 8A is discharged out of the radiator tube fluid channel 22A, the coolant 8 passes through the pump inlet-side tube fluid channel 911A to flow into a heat receiving portion tube fluid channel 9132A. Heat generated at the heat source 62A is transferred to the coolant 8A within the heat receiving portion tube fluid channel 9132A through the low-temperature heat receiving portion 72A. That is, the coolant 8A absorbs the heat generated at the heat source 62A. Thereafter, the coolant 8A is sucked into a pump fluid channel 33A through a pump inlet 421A. The heat source 61A generates a larger amount of heat than the heat source 62A. Here, a case where the radiator 20A has a high heat dissipation characteristic and a case where the radiator 20A has a low heat dissipation characteristic will be considered. In the case where the radiator 20A has a high heat dissipation characteristic, the heat transferred from the high-temperature heat receiving portion 71A to the coolant 8A is cooled at the radiator 20A, and when the coolant 8A thereafter flows into the heat receiving portion tube fluid channel 9132A, the coolant 8A has a temperature lower than that of the low-temperature heat receiving portion 72A. In this case, when the coolant 8A flows out of the heat receiving portion tube fluid channel 9132A, the coolant 8A has a temperature substantially equal to that of the low-temperature heat receiving portion 72A. Thus, when the coolant 8A flows out of the heat receiving portion tube fluid channel 9132A, the coolant 8A has a temperature lower than that of the high-temperature heat receiving portion 71A. Meanwhile, in the case where the radiator 20A has a low heat dissipation characteristic, the heat transferred from the high-temperature heat receiving portion 71A to the coolant 8A is cooled at the radiator 20A, and when the coolant 8A thereafter flows into the heat receiving portion tube fluid channel 9132A, the coolant 8A has a temperature higher than that of the low-temperature heat receiving portion 72A. In this case, when the coolant 8A flows out of the heat receiving portion tube fluid channel 9132A, the coolant 8A has a temperature lower than that of the high-temperature heat receiving portion 71A because the coolant 8A has passed through the radiator 20A. In short, regardless of heat dissipation performance of the radiator 20A, the temperature of the coolant 8A is lower when the coolant 8A flows out of the heat receiving portion tube fluid channel 9132A than when the coolant 8A flows out of the heat receiving portion tube fluid channel 9131A. Therefore, when the heat source which generates the largest amount of heat is arranged at the pump outlet-side tube fluid channel 912A, the temperature of the coolant 8A when the coolant 8A is sucked into the pump 3A can be reduced.

Thus, demagnetization of a magnet 51A of the pump 3A, a damage to coils of a stator 41A, and other problems can be prevented. Thus, according to the present preferred embodiment, the pump 3A having a small thickness can be adopted, and the thickness of the heat module 100A as a whole can be reduced.

Figure 8:
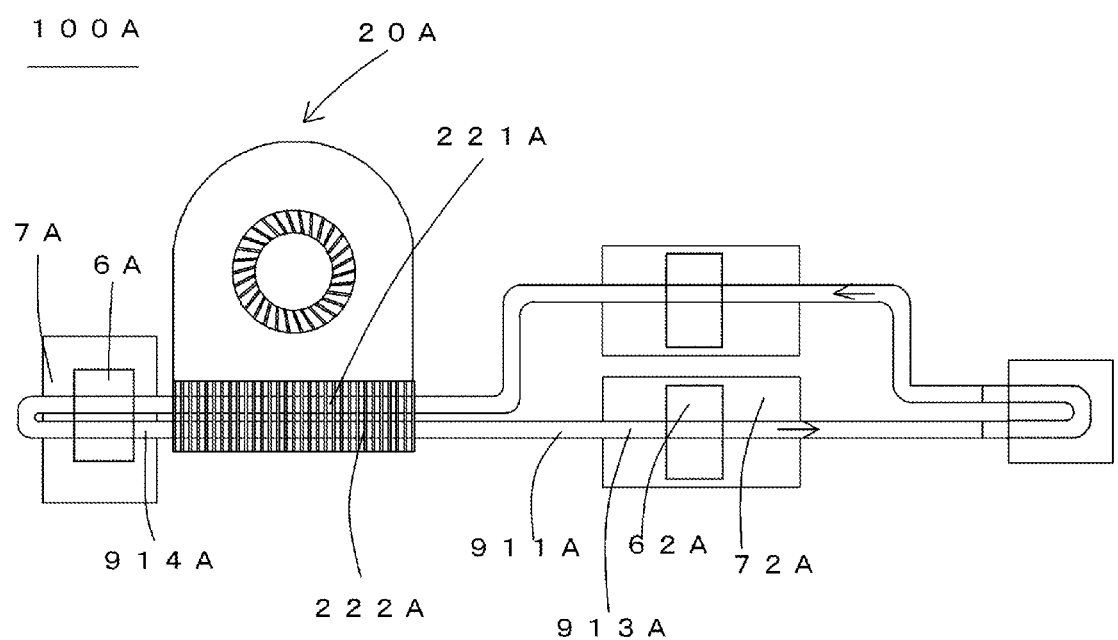
FIG. 8 is a schematic diagram of a heat module according to a modification of the second preferred embodiment of the present invention.

FIG. 8 is a schematic diagram of a heat module 100A according to a modification of the second preferred embodiment of the present invention. In this modification, a radiator tube fluid channel 22A includes a first radiator tube fluid channel 221A connected with a pump outlet-side tube fluid channel 912A, and a second radiator tube fluid channel 222A connected with a pump inlet-side tube fluid channel 911A. A tube fluid channel 91A further includes a radiator connection tube fluid channel 914A arranged to join the first radiator tube fluid channel 221A and the second radiator tube fluid channel 222A to each other. A heat receiving portion tube fluid channel 913A is arranged in the radiator connection tube fluid channel 914A. In a modification of the second preferred embodiment, a low-temperature heat receiving portion 72A for a heat source 62A which generates a small amount of heat may be arranged at the pump inlet-side tube fluid channel 911A.

When a heat receiving portion 7A which receives heat from a heat source 6A is arranged at the radiator connection tube fluid channel 914A, a coolant 8A flows into the radiator connection tube fluid channel 914A after dissipating heat at a radiator 20A, and the coolant 8A is able to effectively absorb heat from the heat source 6A. In addition, after absorbing the heat, the coolant 8A flows out of the radiator connection tube fluid channel 914A, and then flows into the second radiator tube fluid channel 222A and dissipates heat at the radiator 20A. In the case where two heat sources 6A are provided, for example, it is preferable that one of the heat sources 6A be arranged at the radiator connection tube fluid channel 914A, and the other heat source 6A be arranged at the pump outlet-side tube fluid channel 912A. In this case, the coolant 8A passing through the heat receiving portion tube fluid channel 913A at each of the heat sources 6A has dissipated heat at the radiator 20A, and thus, heat of each of the heat sources 6A can be effectively dissipated. Thus, an improvement in cooling performance of the heat module 100A is achieved.

The tube fluid channel 91A is defined by a flexible tube made of a thermally conductive material. Further, the heat module 100A is installed on a base made of a metal or on a case made of a metal, and the flexible tube is arranged to be in thermal contact with the base or the case.

When the tube fluid channel 91A is defined by the flexible tube made of the thermally conductive material, heat of the coolant 8A can be dissipated outwardly through the tube. Thus, the cooling performance of the heat module 100A is improved. Further, when the flexible tube made of the thermally conductive material is arranged to be in thermal contact with the base made of the metal or the case made of the metal, the heat of the coolant 8A inside the flexible tube is transferred to the flexible tube and then to the base made of the metal or the case made of the metal. That is, the heat of the coolant 8A can be effectively dissipated. Thus, the cooling performance of the heat module 100A is improved.

Centrifugal fans according to preferred embodiments of the present invention are usable to cool devices inside cases of notebook PCs and desktop PCs, to cool other devices, to supply air to a variety of objects, and so on. Moreover, centrifugal fans according to preferred embodiments of the present invention are also usable for other purposes.

What is claimed is:

1. A heat module comprising:
   a heat receiving portion arranged to be in thermal contact with a heat source;
   a fluid channel in which a coolant to transfer heat at the heat receiving portion is sealed;
   a centrifugal fan having a single air outlet;
   a radiator arranged at the single air outlet of the fan, the radiator including a plurality of heat dissipating fins; and
   a pump including a stationary portion including a stator, and a rotating portion including a magnet arranged radially outside of the stator, a rotor holder arranged to hold the magnet with an inner circumferential surface thereof, and a pump impeller arranged to surround the stator radially outside of the stator, and supported to be rotatable with respect to the stator, the pump further including a casing made of a resin and arranged to surround the pump impeller radially outside of the stator; wherein the pump having a pump outlet and a pump inlet such that the coolant in the fluid channel is transferred from the pump outlet through the fluid channel to a pump inlet,
   wherein the fluid channel comprising a first fluid channel part, a second fluid channel part, a third fluid channel part, a fourth fluid channel part, a fifth fluid channel part and a sixth fluid channel part,
   wherein the first fluid channel part runs between the pump outlet and the radiator,
   wherein each of the second fluid channel part and the fourth fluid channel part runs inside the radiator, the second fluid channel part being parallel to the fourth fluid channel part such that the second fluid channel part is closer to the air outlet than the fourth fluid channel part,
   wherein the third fluid channel part runs between the second fluid channel part and the fourth fluid channel part,
   wherein the fifth fluid channel part runs between the fourth fluid channel part and the pump inlet,
   wherein the sixth fluid channel part runs inside the pump,
   wherein the coolant in the fluid channel flows through the first fluid channel part, the second fluid channel part, the third fluid channel part, the fourth fluid channel part, the fifth fluid channel part and the sixth fluid channel part in order,
   wherein at least a portion of the rotor holder and at least a portion of the pump impeller are arranged to radially overlap with each other;
   wherein the fluid channel includes a heat receiving portion tube fluid channel arranged in the first fluid channel part to transfer heat of the heat source to the coolant at the heat receiving portion
   wherein no heat receiving portion tube fluid channel is arranged in the fifth fluid channel part.

2. The heat module according to claim 1, wherein the heat receiving portion tube fluid channel is arranged only in the first fluid channel part.

3. The heat module according to claim 2, wherein the heat source comprises a plurality of heat sources comprising:
   a first heat source which generates a first amount of heat; and
   a second heat source which generates a second amount of heat, the first amount being larger than the second amount.

4. The heat module according to claim 3, wherein, of all the plurality of heat sources, the first heat source generates more amount of heat than any other heat sources, wherein the first heat source is arranged closest to the pump outlet.

5. The heat module according to claim 3, wherein
   the plurality of heat receiving portions include a low-temperature heat receiving portion for the second heat source which generates the small amount of heat, and a high-temperature heat receiving portion for the first heat source which generates the first amount of heat; and
   the first fluid channel part is arranged to branch out into a first fluid channel branch and a second fluid channel branch between the pump outlet and the heat receiving portions, the first fluid channel branch being connected with the high-temperature heat receiving portion, the second fluid channel branch being connected with the low-temperature heat receiving portion, the first and second fluid channels joining together between the heat receiving portions and the radiator tube fluid channel.

6. The heat module according to claim 1, wherein the heat source comprises a plurality of heat sources comprising:
   a first heat source which generates a first amount of heat; and
   a second heat source which generates a second amount of heat, the first amount being larger than the second amount.

7. The heat module according to claim 6, wherein, of all the plurality of heat sources, the first heat source which generates more amount of heat than any other heat sources is arranged closest to the pump outlet.

8. The heat module according to claim 6, wherein
   the plurality of heat receiving portions include a low-temperature heat receiving portion for the second heat source which generates the second amount of heat, and a high-temperature heat receiving portion for the first heat source which generates the first amount of heat; and
   the first fluid channel part is arranged to branch out into a first fluid channel branch and a second fluid channel branch between the pump outlet and the heat receiving portions, the first fluid channel branch being connected with the high-temperature heat receiving portion, the second fluid channel branch being connected with the low-temperature heat receiving portion, the first fluid channel branch and the second fluid channel branch joining together between the heat receiving portions and the radiator tube fluid channel.

9. The heat module according to claim 1, wherein the heat receiving portion tube fluid channel is arranged in the third fluid channel part.

10. The heat module according to claim 1, wherein an area of a cross section of each of the second fluid channel part and the fourth fluid channel part is greater than an area of a cross section of the first fluid channel part.

11. The heat module according to claim 2, wherein, a portion of the first fluid channel part between the pump outlet and the heat receiving portion is shorter than a portion of the first fluid channel part between the heat receiving portion and the radiator.

12. The heat module according to claim 1, wherein the fluid channel is defined by a flexible tube made of a thermally conductive material.

13. The heat module according to claim 12, wherein the heat module is installed on a base made of a metal or on a case made of a metal, and the flexible tube is arranged to be in thermal contact with the base or the case.

14. A heat module comprising:
a plurality of heat receiving portions arranged to be in thermal contact with a plurality of heat sources which generate different amounts of heat;
a fluid channel in which a coolant to transfer heat at each heat receiving portion is sealed;
a centrifugal fan having a single air outlet;
a radiator arranged at the single air outlet of the fan, the radiator including a plurality of heat dissipating fins; and
a pump including a stationary portion including a stator, and a rotating portion including a magnet arranged radially outside of the stator, a rotor holder arranged to hold the magnet with an inner circumferential surface thereof, and a pump impeller arranged to surround the stator radially outside of the stator, and supported to be rotatable with respect to the stator, the pump further including a casing made of a resin and arranged to surround the pump impeller radially outside of the stator; wherein the pump having a pump outlet and a pump inlet such that the coolant in the fluid channel is transferred from the pump outlet through the fluid channel to a pump inlet,
wherein the fluid channel comprising a first fluid channel part, a second fluid channel part, a third fluid channel part, a fourth fluid channel part, a fifth fluid channel part and a sixth fluid channel part,
wherein the first fluid channel part 9-1 runs between the pump outlet and the radiator,
wherein each of the second fluid channel part and the fourth fluid channel part runs inside the radiator, the second fluid channel part being parallel to the fourth fluid channel part such that the second fluid channel part is closer to the air outlet than the fourth fluid channel part,
wherein the third fluid channel part runs between the second fluid channel part and the fourth fluid channel part,
wherein the fifth fluid channel part runs between the fourth fluid channel part and the pump inlet,
wherein the sixth fluid channel part runs inside the pump,
wherein the coolant in the fluid channel flows through the first fluid channel part, the second fluid channel part, the third fluid channel part, the fourth fluid channel part, the fifth fluid channel part and the sixth fluid channel part in order,
wherein at least a portion of the rotor holder and at least a portion of the pump impeller are arranged to radially overlap with each other;
wherein the fluid channel comprises a first heat receiving portion tube fluid channel to transfer heat of a first heat source to the coolant, and a second heat receiving portion tube fluid channel to transfer heat of a second heat source to the coolant, the first heat source generating a larger amount of heat than the second heat source; and
wherein the first heat receiving portion tube fluid channel is arranged is arranged in the first fluid channel part.

15. The heat module according to claim 14, wherein the first heat receiving portion tube fluid channel is arranged in the fifth fluid channel part.

16. The heat module according to claim 14, wherein another heat receiving portion tube fluid channel is arranged in the third fluid channel part.

17. The heat module according to claim 14, wherein the fluid channel is defined by a flexible tube made of a thermally conductive material.

18. The heat module according to claim 17, wherein the heat module is installed on a base made of a metal or on a case made of a metal, and the flexible tube is arranged to be in thermal contact with the base or the case.

19. The heat module according to claim 1, wherein the heat module is accommodated in a case having a thickness of 30 mm or less.

20. The heat module according to claim 14, wherein the heat module is accommodated in a case having a thickness of 30 mm or less.

* * * * *